United States Patent
Chen et al.

(10) Patent No.: US 7,892,929 B2
(45) Date of Patent: Feb. 22, 2011

(54) SHALLOW TRENCH ISOLATION CORNER ROUNDING

(75) Inventors: Neng-Kuo Chen, Sinshih Township (TW); Kuo-Hwa Tzeng, Taipei (TW); Cheng-Yuan Tsai, Chu-Pei (TW); Jeffrey Junhao Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/173,263

(22) Filed: Jul. 15, 2008

(65) Prior Publication Data
US 2010/0015776 A1    Jan. 21, 2010

(51) Int. Cl.
*H01L 21/762* (2006.01)

(52) U.S. Cl. .................. 438/296; 438/221; 438/425; 438/426; 257/E21.546; 257/E21.628; 257/E21.642

(58) Field of Classification Search .................. 438/221, 438/296, 424, 435, 428, 436, 438, 425, 426, 438/700; 257/E21.546, E21.549, E21.628, 257/E21.643, E21.633, E21.642, E21.548, 257/E21.54, E21.545, E21.551
See application file for complete search history.

(56) References Cited

U.S. PATENT DOCUMENTS

| | | | |
|---|---|---|---|
| 6,569,741 | B2 | 5/2003 | Houston et al. |
| 6,746,933 | B1 * | 6/2004 | Beintner et al. ............. 438/424 |
| 6,878,575 | B2 | 4/2005 | Yoo et al. |
| 6,974,755 | B2 | 12/2005 | Ko et al. |
| 2006/0154438 | A1 * | 7/2006 | Kishimoto et al. .......... 438/424 |
| 2006/0205164 | A1 * | 9/2006 | Ko et al. ..................... 438/424 |

* cited by examiner

*Primary Examiner*—Julio J Maldonado
(74) *Attorney, Agent, or Firm*—Slater & Matsil, L.L.P.

(57) ABSTRACT

A method for rounding the corners of a shallow trench isolation is provided. A preferred embodiment comprises filling the trench with a dielectric and recessing the dielectric to expose a portion of the sidewalls of the trench adjacent to the surface of the substrate. The substrate is then annealed in a hydrogen ambient, which rounds the corners of the shallow trench isolation through silicon migration.

20 Claims, 4 Drawing Sheets

SHALLOW TRENCH ISOLATION CORNER ROUNDING

TECHNICAL FIELD

The present invention relates generally to a system and method for manufacturing semiconductor devices, and more particularly to a system and method for rounding the corners of a shallow trench isolation.

BACKGROUND

Generally, shallow trench isolations (STIs) are used to separate and isolate active areas on a semiconductor wafer from each other. These STIs have historically been formed by etching trenches, overfilling the trenches with a dielectric such as an oxide, and then removing any excess oxide with a process such as chemical mechanical polishing (CMP) or etching in order to isolate the dielectric in the trenches. This dielectric helps to electrically isolate the active areas from each other.

However, by simply etching and filling the trenches, the corners of the trenches adjacent to the surface of the substrate are formed with a sharp, almost square shape. This sharp shape can cause significant cycling leakage, which detracts from the overall performance of the devices formed on the substrate. In an attempt to mitigate this cycling leakage, the corners of the substrate have historically been rounded by growing an oxide liner on the corner, thereby forming a rounded silicon corner.

However, this method of rounding the corners has only a limited efficiency. Further, as the scale of devices such as transistors is reduced to 45 nm below, the problems with cycling leakage will become more pronounced, and the oxide liner method of rounding the corners are not sufficient to handle the cycling leakage.

Accordingly, what is needed is a new method of rounding the corners of a substrate adjacent to an STI so as to minimize the cycling leakage for devices formed on the substrate.

SUMMARY OF THE INVENTION

These and other problems are generally solved or circumvented, and technical advantages are generally achieved, by preferred embodiments of the present invention that allow for a method to reshape silicon surfaces using an annealing process.

In accordance with a preferred embodiment of the present invention, a method for forming shallow trench isolations comprises providing a substrate with a trench formed therein, the trench comprising sidewalls. At least a portion of the sidewalls adjacent to a surface of the substrate is annealed in an ambient atmosphere comprising hydrogen.

In accordance with another preferred embodiment of the present invention, a method for manufacturing a semiconductor device comprises providing a substrate, wherein the substrate comprises a trench with sidewalls and an exposed active area on the surface of the substrate. The trench is filled with a first fill material, and the first fill material is recessed to expose a portion of the substrate along the sidewalls. The exposed portion of the substrate along the sidewalls and the exposed active areas are annealed in a hydrogen ambient.

In accordance with yet another preferred embodiment of the present invention, a method for manufacturing a semiconductor device comprises providing a substrate and forming an opening in the substrate. The opening is filled with a first fill material, and at least a portion of the first fill material is removed so as to expose a portion of the substrate along a side of the opening. The substrate is annealed in an ambient atmosphere comprising hydrogen.

An advantage of a preferred embodiment of the present invention is that the corners of the substrate adjacent to the trenches are rounded to a larger degree than previous methods, thereby reducing cycling leakage that can become a problem as devices are scaled down to below 45 nm.

A further advantage of a preferred embodiment of the present invention is that the hydrogen ambient additionally etches any dielectric fences that are formed in the trench, thereby making the rounded corners even more efficient at preventing cycling leakage.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a shallow trench isolation. The invention may also be applied, however, to other structures.

Figure 1:
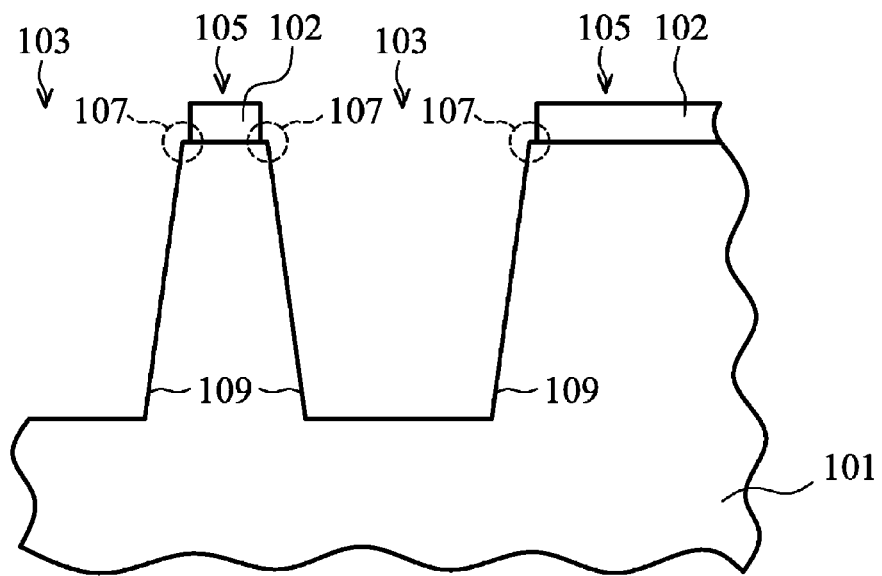
FIG. 1 illustrates a substrate with an active area and a trench in accordance with an embodiment of the present invention.

With reference now to FIG. 1, there is shown a substrate 101 with a masking layer 102 exposing trenches 103 that separate active areas 105 on the surface of the substrate 101. The substrate 101 may comprise bulk silicon, doped or undoped, or an active layer of a silicon on insulator (SOI) substrate. Generally, an SOI substrate comprises a layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

The active areas 105 are preferably an electrically conductive region of the substrate 101 adjacent to the top surface of the substrate 101. The active areas 105 will preferably be used to form the base material for active devices (such as transistors, resistors, etc.) to be formed later. The active areas 105 are preferably formed by the implantation of suitable materials into the crystal silicon substrate, as is well known in the art. Depending upon the materials chosen, the active areas 105 may comprise either an n-well or a p-well as preferably determined by the design requirements.

The masking layer 102 is preferably formed over the substrate to protect the active areas 105 while also exposing portions of the substrate 101 to form the trenches 103. The masking layer 102 is preferably a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the masking layer 102 is preferably patterned through a suitable photolithographic process to expose those portions of the substrate 101 that will form the trenches 103.

As one of skill in the art will recognize, however, the processes and materials described above to form the masking layer 102 are not the only method that may be used to protect the active areas 105 while exposing portions of the substrate 101 for the formation of trenches 103. Any suitable process, such as a patterned and developed photoresist, may alternatively be utilized to protect the active areas 105 of the substrate 101 while exposing portions of the substrate 101 to be removed to form the trenches 103. All such methods are fully intended to be included in the scope of the present invention.

Once the masking layer 102 has been formed and patterned, the trenches 103 are formed in the substrate. Preferably, the exposed substrate 101 is removed through a suitable process such as reactive ion etching (RIE) in order to form the trenches 103 in the substrate 101, although other suitable processes may alternatively be used. The trenches 103 are preferably formed to be between about 2,500 Å and about 5,000 Å in depth from the surface of the substrate 101, with a preferred depth of about 3,000 Å.

The formation of the trenches 103 additionally forms corners 107 (circled in FIG. 1) that join the preferably planar surface of the active areas 105 to the sidewalls 109 of the trenches 103. The corners 107 at this stage are substantially non-rounded by-products of the formation of the trenches 103, and may cause significant cycling leakage without further processing.

Figure 2:
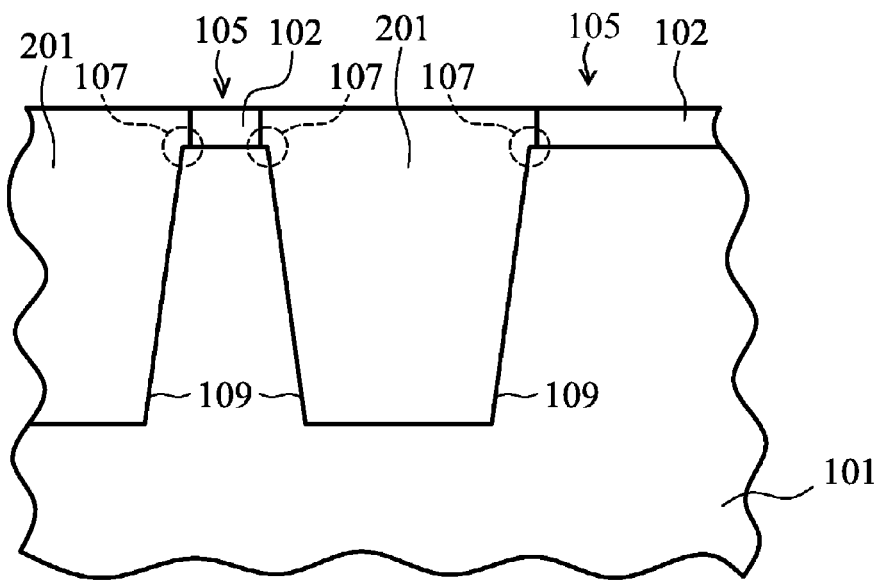
FIG. 2 illustrates the filling of the trenches with a dielectric material in accordance with an embodiment of the present invention.

FIG. 2 illustrates the filling of the trenches 103 with a dielectric material 201. The dielectric material 201 is preferably an oxide material, a high-density plasma (HDP) oxide, or the like. The dielectric material 201 is also preferably formed using either a chemical vapor deposition (CVD) method, such as the HARP process, a high density plasma CVD method, or other suitable method of formation as is known in the art.

The trenches 103 are preferably filled by overfilling the trenches 103 and the masking layer 102 with the dielectric material 201 and then removing the excess material outside of the trenches 103 and masking layer 102 through a suitable process such as chemical mechanical polishing (CMP), an etch, a combination of these, or the like. The removal process preferably removes any dielectric material 201 that is located over the masking layer 102 as well, so that the removal of the masking layer 102 will expose the active areas 105 to further process steps.

Figure 3:
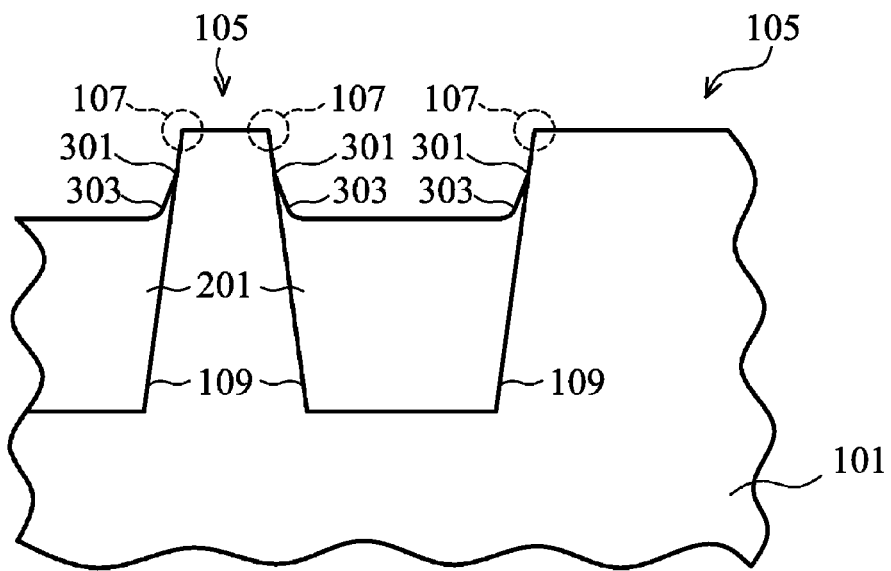
FIG. 3 illustrates the recessing of the dielectric material in the trenches in accordance with an embodiment of the present invention.

FIG. 3 illustrates the removal of the masking layer 102 and the recessing of the dielectric material 201 once the trenches 103 have been filled with the dielectric material 201. The masking layer 102 is preferably removed using a dry etch that selectively removes the masking layer 102 without substantially removing the active areas 105 of the substrate 101. In an embodiment in which the masking layer 102 comprises silicon nitride, the masking layer 102 may be removed using an etchant such as $CF_4$—$O_2$, although other etchants, such as $CHF_2/O_2$, $CH_2F_2$, $CH_3F$, or the like, may alternatively be used. However, while the above process is preferred to remove the masking layer 102, the present invention is not intended to be limited to just the processes listed. Any suitable process that may be used to remove the masking layer 102 may alternatively be used and is fully intended to be within the scope of the present invention.

After the masking layer 102 has been removed, the recessing is preferably performed to expose at least a portion 301 of the sidewalls 109 of the trenches 103 adjacent to the top surface of the substrate 101. The dielectric material 201 is preferably recessed using a wet etch by dipping the top surface of the substrate 101 into an etchant such as HF, although other etchants, such as $H_2$, and other methods, such as a reactive ion etch, or a dry etch with etchants such as $NH_3/NF_3$, may alternatively be used.

The dielectric material 201 is preferably recessed to a depth from the surface of the substrate 101 of between about 300 Å to about 500 Å, with a preferred depth of about 400 Å. The recessing exposes a portion of the sidewalls 301 of the trenches 103 such that the dielectric material 201 is not covering those portions of the sidewalls 301. Additionally, the recessing also preferably ensures that there is no leftover dielectric material 201 located over the active areas 105 of the substrate 101, and that the active areas 105 of the substrate 101 are exposed to further processing conditions.

The recessing of the dielectric material 201 also forms dielectric fences 303 along the sidewalls of the trenches 103 as a central portion of the dielectric material 201 is etched faster than portions adjacent the sidewalls of the trenches 103. Accordingly, these dielectric fences 303 thicken as they transition from adjacent the exposed portions of the sidewalls 301 to the main portion of the dielectric material 201. These dielectric fences 303 can cause problems such as a leakage path or gate current leakage, and can degrade the overall performance devices formed on the active areas 105.

Figure 4:
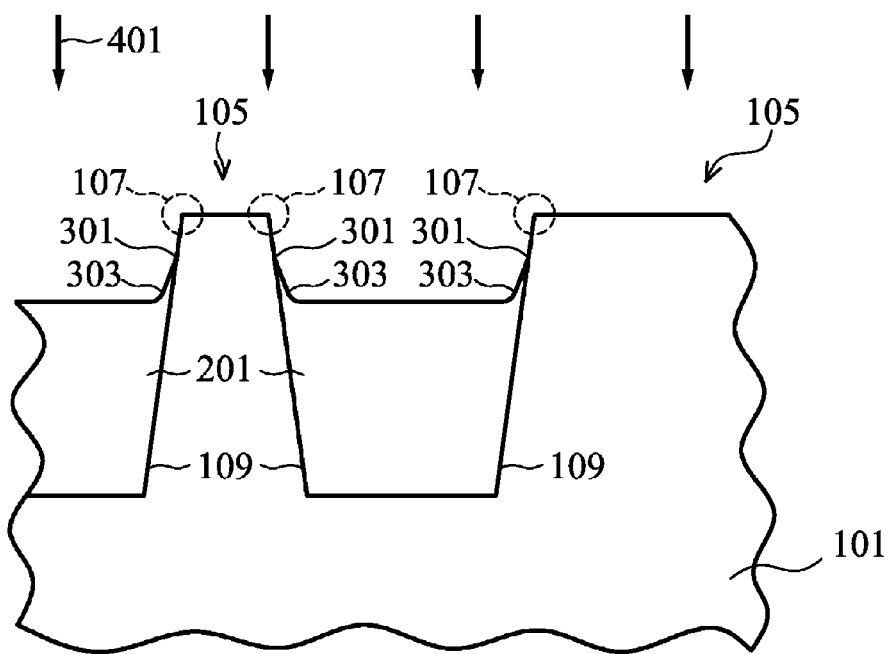
FIG. 4 illustrates the annealing of the substrate in accordance with an embodiment of the present invention.

FIG. 4 illustrates annealing (represented in FIG. 4 by the arrows labeled 401) the substrate 101 to round the corners 107 of the substrate 101 adjacent the trenches 103. The annealing 401 is preferably performed in order to initiate silicon migration along the exposed surfaces of the substrate 101. This silicon migration at the corners 107 of the trenches 103 causes the corners 107 to change shape to a more rounded shape, thereby reducing the cycling leakage and increasing the overall efficiency of the devices formed on the active areas 105.

The annealing 401 is preferably performed using an ambient atmosphere that initiates the silicon migration, such as pure hydrogen gas. Other gases that can initiate silicon migration, such as $NH_3$, $SiH_4$, combinations of these, or the like, may alternatively be used. The pure hydrogen gas is preferably introduced at a flow rate of between about 15 liters per second and about 55 liters per second, with a preferred flow rate of 35 liters per second. The chamber for the annealing 401 is preferably kept at a temperature of between about 800°

C. and about 1,100° C., with a preferred temperature of about 875° C., and a pressure of between about 5 torr and about 760 torr, with a preferred pressure of about 100 torr. The substrate 101 is preferably annealed 401 between about 30 seconds and about 600 seconds, with a preferred time of about 90 seconds.

Additionally, the ambient atmosphere is preferably substantially free of oxygen or oxygen containing components. Oxygen or oxygen containing components may reduce the efficiency of the rounding of the corners 107 of the trenches 103, and may even cause a consumption of the exposed active area 105. By removing oxygen and oxygen containing components from the ambient atmosphere, the efficiency of the silicon migration can be increased without any deleterious effects to the active area 105.

Figure 5:
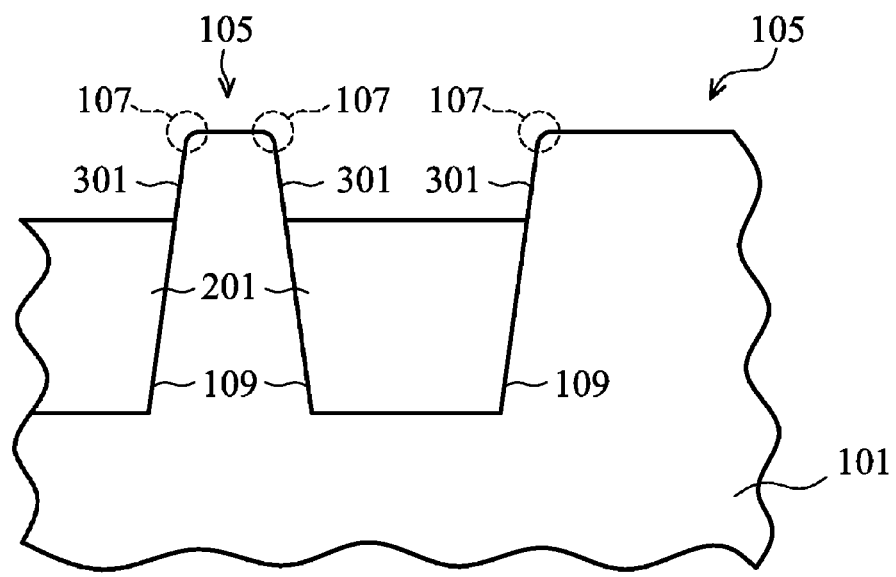
FIG. 5 illustrates the results of the annealing in accordance with an embodiment of the present invention.

FIG. 5 illustrates the results of the anneal 401. Most notably, the corners 107 of the trenches 103 have been rounded through the instigation of silicon migration. This rounding is greater than can be achieved through the prior art technique of using an oxide liner, and provides for much less cycling leakage, thereby improving the overall performance of the devices formed on the substrate 101.

Additionally, if hydrogen is utilized in the anneal 401, the hydrogen will additionally etch the dielectric fences 303. Thus, annealing 401 with hydrogen will also reduce or eliminate the dielectric fences 303 as well as instigating the silicon migration. By reducing or eliminating the dielectric fences 303, the negative effects of the dielectric fences 303 will also be mitigated, thereby improving the overall performance of the devices formed on the active areas 105 of the substrate 101.

Figure 6:
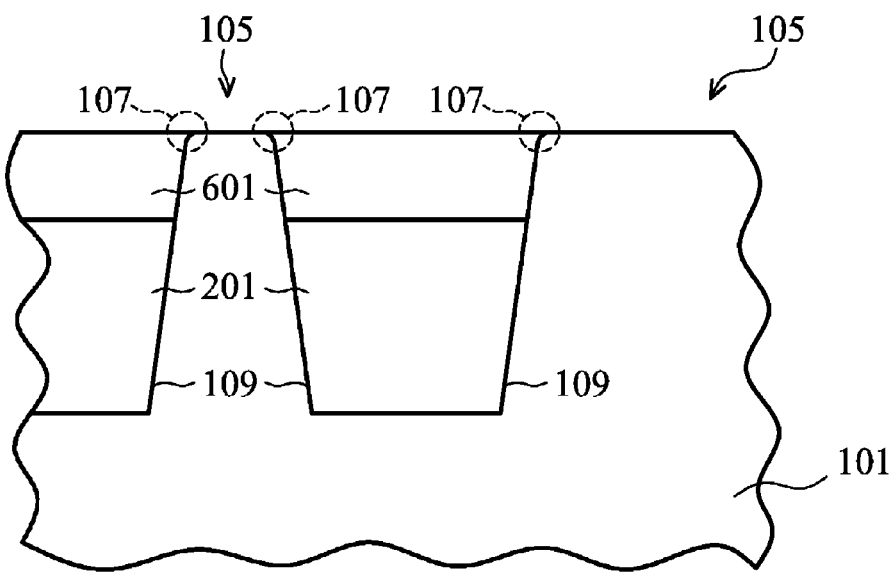
FIG. 6 illustrates an optional fill of the trenches with a second dielectric material in accordance with an embodiment of the present invention.

FIG. 6 illustrates an optional refill of the trenches 103 with a second dielectric material 601. The second dielectric material 601 is preferably made from a similar material as the first dielectric material 201 (e.g., an oxide) described above with reference to FIG. 2, and is also preferably made through a similar process (e.g., CVD). The second dielectric material 601 is preferably formed over the first dielectric material 201 and overfills the trenches 103. Excess material is then preferably removed using a process such as CMP, an etch, a combination of these, or the like, until the active areas 105 of the substrate 101 are exposed and the second dielectric material 601 is isolated within the trenches 103.

Figure 7:
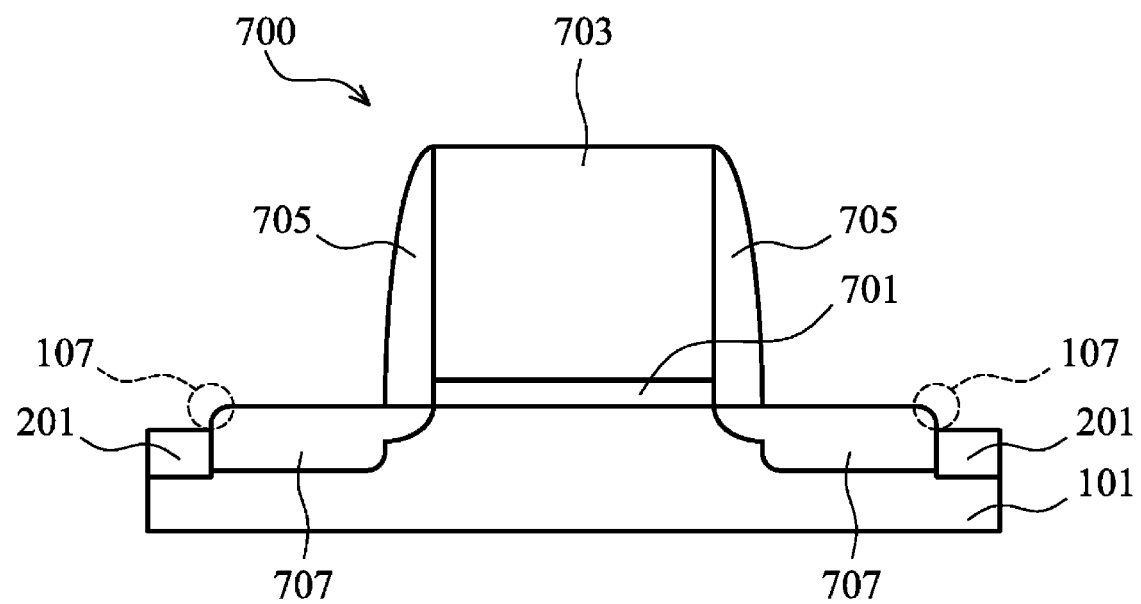
FIG. 7 illustrates the formation of a transistor on an active area separated by shallow trench isolation in accordance with an embodiment of the present invention.

FIG. 7 illustrates the formation of a transistor 700 after the rounding of the corners 107 of the trenches 103 has been performed. The transistor 700 preferably comprises a gate dielectric 701 and a gate electrode 703, spacers 705, and source/drain regions 707. The dielectric layer 701 is preferably a high-K dielectric material, such as silicon oxide, silicon oxynitride, silicon nitride, an oxide, a nitrogen-containing oxide, a combination thereof, or the like. Preferably, the dielectric layer 701 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the dielectric layer 701 comprises an oxide layer, the dielectric layer 701 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the dielectric layer 701 is between about 8 Å to about 200 Å in thickness.

The gate electrode 703 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In the preferred embodiment in which the gate electrode 703 is poly-silicon, the gate electrode 703 may be formed by depositing doped or undoped poly-silicon by low-pressure chemical vapor deposition (LPCVD) to a thickness in the range of about 400 Å to about 2,500 Å, but more preferably about 1,500 Å.

The spacers 705 are preferably formed by blanket depositing a spacer layer (not shown) over the previously formed structure. The spacer layer preferably comprises SiN, oxynitride, SiC, SiON, oxide, and the like and is preferably formed by commonly used methods such as chemical vapor deposition (CVD), plasma enhanced CVD, sputter, and other methods known in the art. The spacers 705 are then patterned, preferably by anisotropically etching and removing the spacer layer from the horizontal surfaces of the structure.

In the preferred embodiment, the source/drain regions 707 are formed by one or more implantations of impurities, such as arsenic or boron, into the substrate 101. The source/drain regions 707 may be formed such that the device is either an NMOS device or a PMOS device. Because the gate electrode 703 and spacers 705 are used as masks, the source/drain regions 707 are substantially aligned with the gate electrode 703 and the respective spacers 705.

It should be noted that, though the above-described process to form source/drain regions 707 describes a specific process, one of ordinary skill in the art will realize that many other processes, steps, or the like may be used. For example, one of ordinary skill in the art will realize that a plurality of implants may be performed using various combinations of spacers and liners to form source/drain regions 707 having a specific shape or characteristic suitable for a particular purpose. Any of these processes may be used to form the source/drain regions 707, and the above description is not meant to limit the present invention to the steps presented above.

By annealing the exposed corners of the trench in a hydrogen atmosphere, the corners of the trenches can be rounded to a greater extent that merely forming an oxide liner over the corners. Additionally, by using a hydrogen atmosphere, the dielectric fences can be reduced or eliminated from the sidewalls of the trenches. These improvements lead to a reduced cycling leakage, which has a direct and beneficial effect on any devices formed on or within the active areas of the substrate.

Although the present invention and its advantages have been described in detail, it should be understood that various changes, substitutions and alterations can be made herein without departing from the spirit and scope of the invention as defined by the appended claims. For example, any suitable dielectric material can be used to fill the trenches, and any suitable active devices (such as capacitors or inductors) may be formed on the active areas of the substrate.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming shallow trench isolations comprising:
   providing a substrate with a trench formed therein, the trench comprising sidewalls;
   filling the trench with a first fill material;
   recessing the first fill material in the trench to expose at least a portion of the sidewalls adjacent to the surface of the substrate, wherein a first portion of the first fill material located adjacent to a sidewall of the trench is recessed less than a center of the first fill material; and
   annealing the exposed portion of the sidewalls in an ambient atmosphere being substantially free of oxygen and comprising hydrogen.

2. The method of claim 1, wherein the ambient atmosphere is substantially pure hydrogen.

3. The method of claim 1, wherein the recessing the first fill material also removes the first fill material from the substrate so as to substantially expose the surface of the substrate.

4. The method of claim 1, further comprising removing dielectric fences formed by recessing the first fill material, wherein the removing dielectric fences is performed by the annealing at least a portion of the sidewalls.

5. The method of claim 1, further comprising filling the trench with a second fill material subsequent to annealing at least a portion of the sidewalls.

6. The method of claim 1, wherein recessing the first fill material is performed at least in part through a wet etch.

7. The method of claim 1, wherein the first fill material is an oxide.

8. The method of claim 1, wherein the hydrogen ambient is formed at least in part through a process that has a hydrogen flow rate of between about 15 liters per second and about 55 liters per second.

9. A method for manufacturing a semiconductor device comprising:
   providing a substrate comprising:
      a trench with sidewalls; and
      an exposed active area on a surface of the substrate;
   partially filling the trench with a first fill material such that corners between the sidewalls and the active area are substantially exposed, the first fill material extending away from a bottom of the trench further along the sidewalls than in a center of the trench; and
   rounding the exposed corners by annealing the exposed corners and the exposed active area in a substantially oxygen-free silicon migration initiating ambient.

10. The method of claim 9, wherein the silicon migration initiating ambient is hydrogen.

11. The method of claim 10, wherein the silicon migration initiating ambient is formed at least in part through a process that has a hydrogen flow rate of between about 15 liters per second and about 55 liters per second.

12. The method of claim 9, wherein the partially filling the trench with a first fill material is performed at least in part by filling the trench with a first fill material and removing at least a portion of the first fill material.

13. The method of claim 9, further comprising filling the trench with a second fill material after annealing the exposed portion of the substrate.

14. The method of claim 9, wherein the first fill material is an oxide.

15. The method of claim 9, wherein the annealing the exposed corners also removes dielectric fences formed during recessing the first fill material.

16. A method for manufacturing a semiconductor device comprising:
   providing a substrate;
   forming an opening in the substrate;
   filling the opening with a first fill material;
   removing at least a portion of the first fill material so as to expose a portion of the substrate along a side of the opening, wherein the removing recesses a center of the portion of the first fill material more than a region of the first fill material located adjacent to sidewalls of the opening; and
   annealing the substrate in an ambient atmosphere comprising hydrogen, wherein the ambient atmosphere comprises a hydrogen flow rate of between about 15 liters per second and about 55 liters per second.

17. The method of claim 16, wherein the ambient atmosphere is pure hydrogen.

18. The method of claim 16, wherein removing at least a portion of the first fill material is performed at least in part through a wet etch.

19. The method of claim 16, wherein the first fill material is an oxide.

20. The method of claim 16, wherein the ambient atmosphere comprises hydrogen flowing at a rate of about 35 liters per seconds.

* * * * *